US008885383B1

(12) United States Patent
Yeh et al.

(10) Patent No.: US 8,885,383 B1
(45) Date of Patent: Nov. 11, 2014

(54) FLASH MEMORY AND LAYOUT METHOD THEREOF

(71) Applicant: Winbond Electronics Corp., Taichung (TW)

(72) Inventors: Jun-Lin Yeh, Jhubei (TW); Ting-Kuo Yen, Tongxiao Township, Miaoli County (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 14/037,844

(22) Filed: Sep. 26, 2013

(51) Int. Cl.
*G11C 5/06* (2006.01)
*G11C 5/02* (2006.01)
*H01L 23/52* (2006.01)
*G11C 16/26* (2006.01)
*H01L 21/768* (2006.01)

(52) U.S. Cl.
CPC ...... *G11C 5/06* (2013.01); *G11C 16/26* (2013.01); *H01L 21/768* (2013.01)
USPC .......... 365/63; 365/51; 365/72; 257/207; 257/211; 257/E23.079; 257/E23.153

(58) Field of Classification Search
USPC .......................................................... 365/63
See application file for complete search history.

(56) References Cited

U.S. PATENT DOCUMENTS 7,528,473 B2 * 5/2009 Suwa et al. ............. 257/681
8,811,055 B2 * 8/2014 Yoon ...................... 365/51

\* cited by examiner

*Primary Examiner* — Son Mai
(74) *Attorney, Agent, or Firm* — Muncy, Geissler, Olds & Lowe, P.C.

(57) ABSTRACT

A flash memory is disclosed. A core array stores data. A peripheral circuit accesses the data stored in the core array to generate read data. A off-chip driver (OCD) processes the read data to generate output data. An interconnect structure is electrically connected to the core array, the peripheral circuit, and the OCD and includes three conductive layers. The conductive layers are electrically connected to each other. An uppermost conductive layer is formed over the interconnect structure, electrically connected to the interconnect structure, and includes a first power pad and first power tracks. The first power pad is electrically connected to a power pin via a first bonding wire to receive an operation voltage. The first power tracks are electrically connected between the first power pad and the interconnect structure to transmit the operation voltage to at least one of the core array, the peripheral circuit and the OCD.

11 Claims, 7 Drawing Sheets

FLASH MEMORY AND LAYOUT METHOD THEREOF

BACKGROUND OF THE INVENTION

1. Field of the Invention

The invention relates to a memory, and more particularly to a flash memory.

2. Description of the Related Art

Flash memories are non-volatile memories and are widely used in personal digital assistants (PDAs), notebooks (NBs), walkmans, digital still cameras (DSCs) and mobile phones. As technological developments advance, the size of flash memory is becoming smaller and smaller, due in large part to the thickness of the metal layers in the flash memory becoming thinner and thinner. Since the metal lines in the metal layers are configured to transmit power, the power can be easily interfered by noise.

BRIEF SUMMARY OF THE INVENTION

In accordance with an embodiment, a flash memory comprises a core array, a peripheral circuit, an off-chip driver (OCD), an interconnect structure and an uppermost conductive layer. The core array stores data. The peripheral circuit accesses the data stored in the core array to generate read data. The OCD processes the read data to generate output data. The interconnect structure is electrically connected to the core array, the peripheral circuit and the OCD, and comprises a first conductive layer, a second conductive layer and a third conductive layer. The first, second and third conductive layers are electrically connected to each other. The uppermost conductive layer is formed over the interconnect structure, electrically connected to the interconnect structure, and comprises a first power pad and first power tracks. The first power pad is electrically connected to a power pin via a first bonding wire to receive an operation voltage. The first power tracks are electrically connected between the first power pad and the interconnect structure to transmit the operation voltage to the core array, the peripheral circuit, and/or the OCD.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
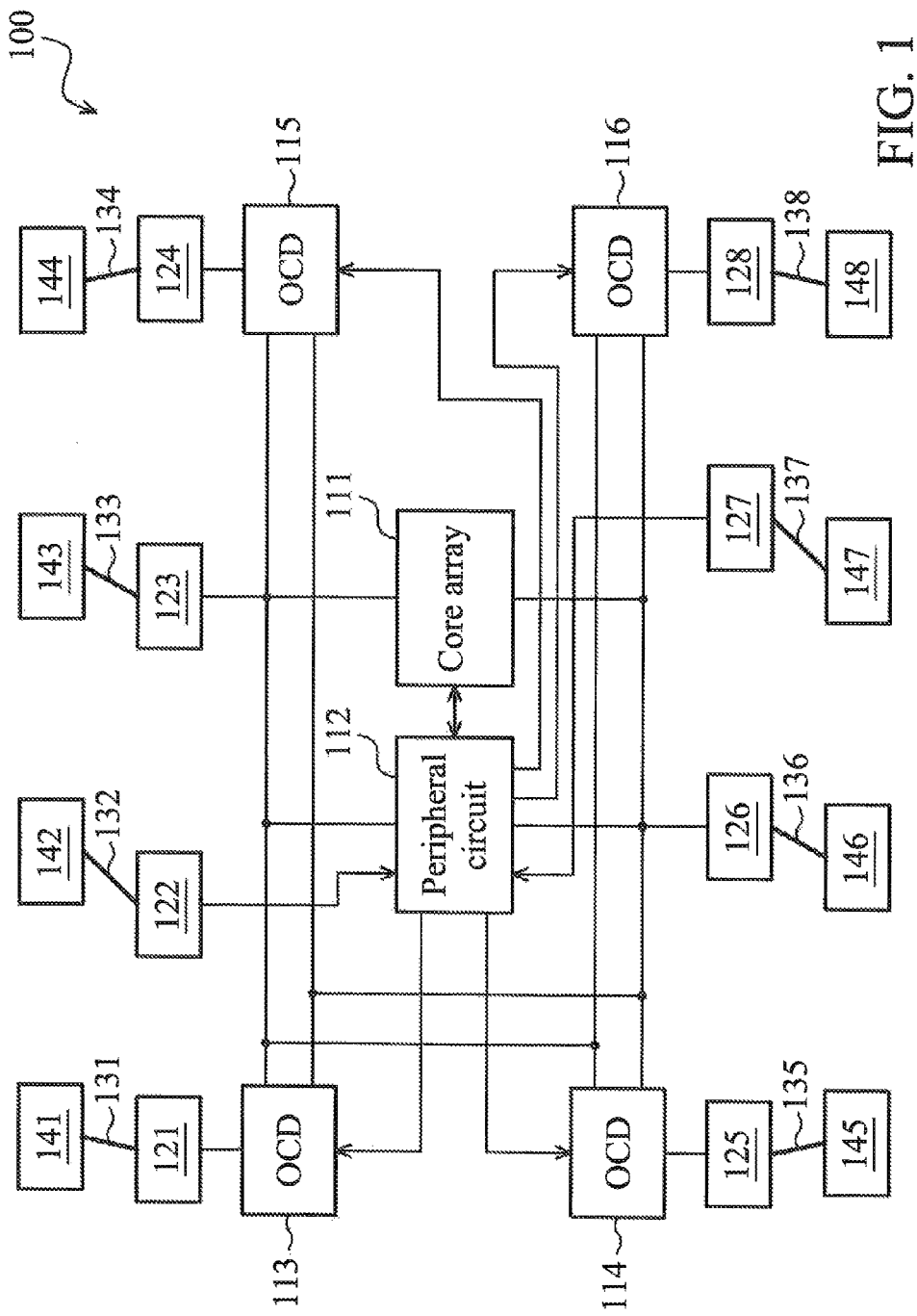
FIG. 1 is a structure diagram of an exemplary embodiment of a flash memory in accordance with some embodiments.

FIG. 1 is a structure diagram of an exemplary embodiment of a flash memory in accordance with some embodiments. The flash memory 100 comprises a core array 111, a peripheral circuit 112, off-chip drivers (OCDs) 113-116 and pads 121-128.

The core array 111 comprises memory cells (not shown) for storing data. In some embodiments, the memory cells are arranged to form an array. The disclosure does not limit the circuit structure of the memory cells. Any circuit can serve as the core array 111, as long as the circuit is capable of storing data. In some embodiments, the core array 111 operates according to an operation voltage received by the pads 123 and 126.

The peripheral circuit 112 accesses the data stored in the core array 111 to generate read data. In one embodiment, the peripheral circuit 112 writes data received by the pads 121, 124, 125 and 128 to the core array 111 according to external commands received by the pads 122 and 127. In another embodiment, the peripheral circuit 112 reads data stored in the core array 111 and outputs the stored data to an external accessing device (not shown) via the pads 121, 124, 125 and 128 according to external commands received by the pads 122 and 127. In some embodiments, the peripheral circuit 112 operates according to the operation voltage received by the pads 123 and 126.

The disclosure does not limit the circuit structure of the peripheral circuit 112. Any circuit can serve as the peripheral circuit 112, as long as the circuit is capable of accessing the core array 111. For example, the peripheral circuit 112 comprises hardware elements, such as micro-processors, micro-controllers, decoders and registers. Therefore, the peripheral circuit 112 is capable of reading the data stored in the core array 111 or writing data to the core array 111 according to the external commands.

The OCDs 113-116 are configured to transmit data. In some embodiments, the OCDs operate according to the operation voltage received by the pads 123 and 126. During a read period, the OCDs 113-116 process the read data generated by the peripheral circuit 112 to generate output data. During a write period, the OCDs 113-116 receive and process external data provided by an external access device and then provide the processed data to the peripheral circuit 112.

The peripheral circuit 112 outputs data via the OCDs 113-116. In some embodiments, the peripheral circuit 112 divides the read data into four groups and outputs the four groups via the OCDs 113-116, respectively. The disclosure does not limit the number of OCDs. In one embodiment, a flash memory only has one OCD. In other embodiments, the flash memory may include four, eight, or sixteen OCDs. In other embodiments, different OCDs transmit data via different pads.

In this embodiment, the flash memory 100 further comprises bonding wires 131-138 and pins 141-148. The bonding wires 131-138 are coupled between the corresponding pads 121-128 and the corresponding pins 141-148. For example, the bonding wire 131 is coupled between the pad 121 and the pin 141, and the bonding wire 138 is coupled between the pad 128 and the pin 148.

In some embodiments, the pads 121, 124, 125 and 128 are referred to as input/output (I/O) pads. The pad 121 is electrically connected to the pin 141 via the bonding wire 131. The pad 124 is electrically connected to the pin 144 via the bonding wire 134. The pad 125 is electrically connected to the pin 145 via the bonding wire 135. The pad 128 is electrically connected to the pin 148 via the bonding wire 138. Therefore, the pins 141, 144, 145 and 148 are referred to as I/O pin for transmitting data. In some embodiments, the pins 141, 144, 145 and 148 transmit data according to a serial transmission method. Therefore, the flash memory 100 is referred to as a serial peripheral interface (SPI) flash.

The pads 122 and 127 are control pads. The pad 122 is electrically connected to the pin 142 via the bonding wire 132 for receiving the external control commands, such as a chip select (CS) signal. The pad 127 is electrically connected to the pin 147 via the bonding wire 137 for receiving the external control commands, such as a clock signal (SCL). The peripheral circuit 112 accesses the core array 111 according to the CS signal and the SCL signal received by the pins 142 and 147.

The pads 123 and 126 serve as power pads to provide power to the core array 111 the peripheral circuit 112 and the OCDs 113-116. As shown in FIG. 1, the pad 123 is electrically connected to the pin 143 via the bonding wire 133 to receive a high operation voltage, and the pad 126 is electrically connected to the pin 146 via the bonding wire 136 to receive a low operation voltage. In one embodiment, the high operation voltage exceeds the low operation voltage.

In some embodiments, the signal connecting line among the core array 111, the peripheral circuit 112, and the OCDs 113-116 is provided by an interconnect structure. In some embodiments, the interconnect structure comprises three conductive layers and contact holes to electrically connect the core array 111, the peripheral circuit 112 and the OCDs 113-116. In this embodiment, an uppermost conductive layer (not shown) is utilized to provides power tracks, and it transmits power to the core array 111, the peripheral circuit 112 and/or the OCDs 113-116 via the interconnect structure. The interconnect structure and the uppermost conductive layer are described in more detail later.

Figure 2:
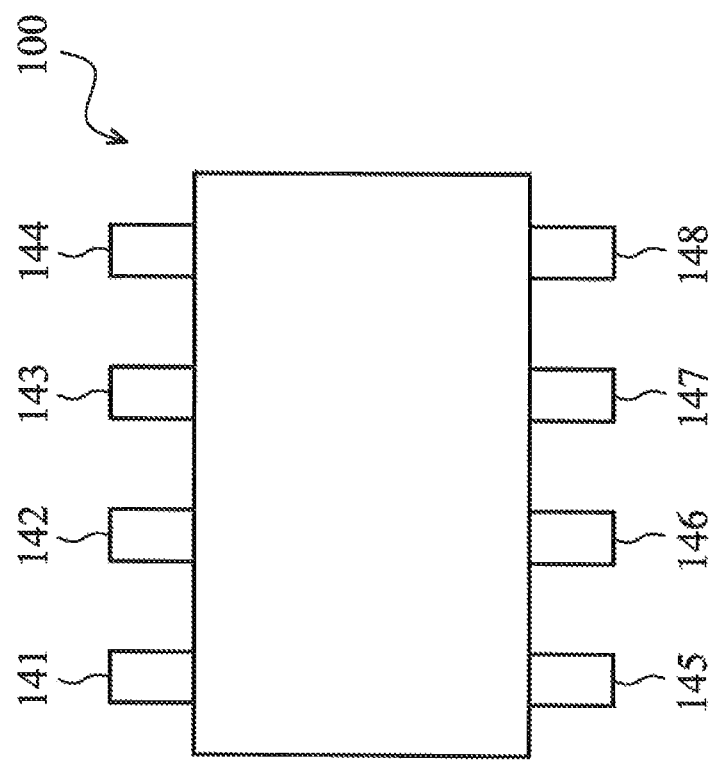
FIG. 2 is a bonding schematic diagram of an exemplary embodiment of a flash memory in accordance with some embodiments.

FIG. 2 is a bonding schematic diagram of an exemplary embodiment of a flash memory in accordance with some embodiments. After a bonding procedure, the flash memory 100 receives data, commands or operation voltages provided by an external device, or provides output data to the external device via the pins 141-148. The disclosure does not limit the number of the pins. In other embodiments, the flash memory 100 transmits data or commands by a different number of pins. In this embodiment, the pins 141, 144, 145 and 148 are I/O pins to transmit data, the pins 142 and 147 are command pins to receive control commands, and the pins 143 and 146 are power pins to receive operation voltages.

Figure 3:
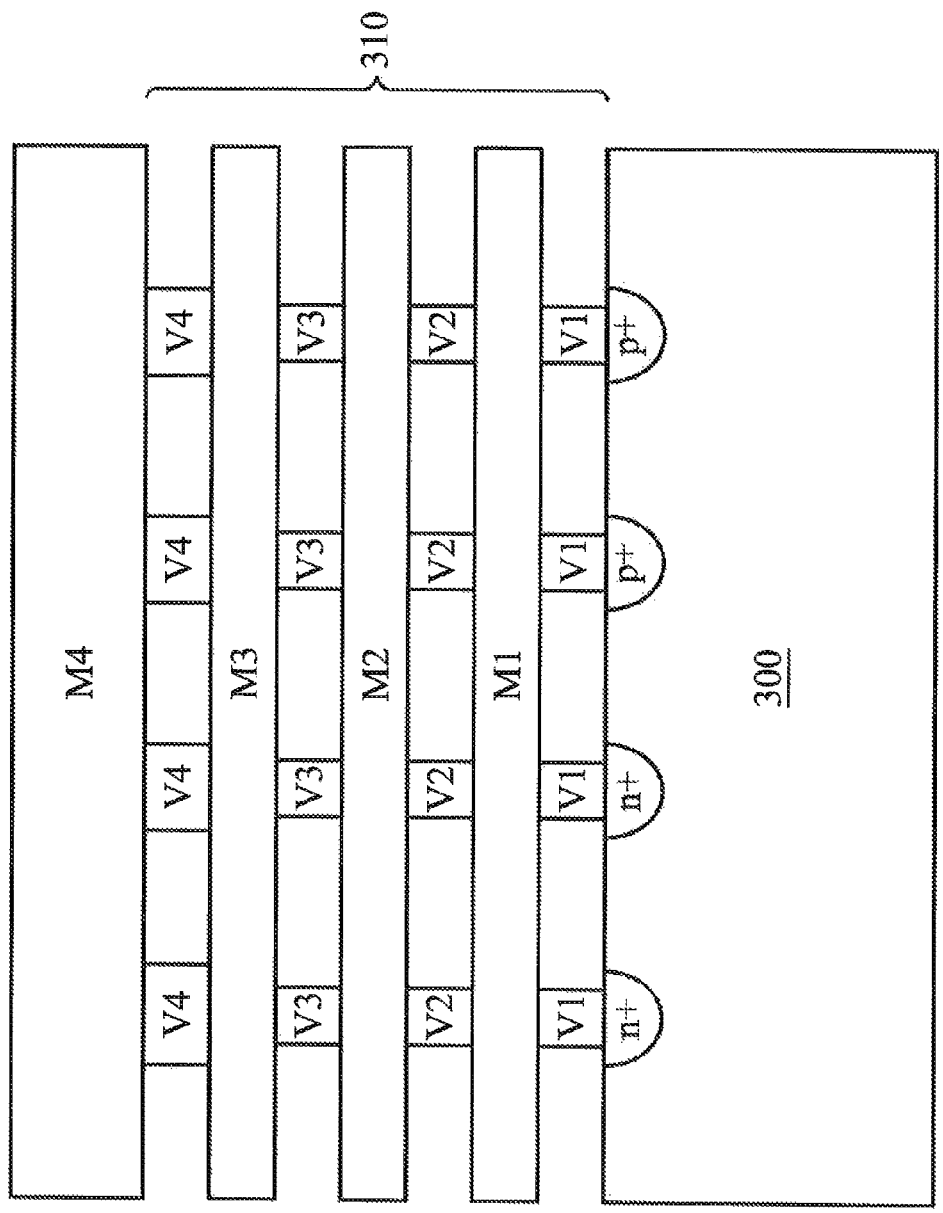
FIG. 3 is a schematic diagram of an exemplary embodiment of an interconnect structure and an uppermost conductive layer in accordance with some embodiments.

FIG. 3 is a schematic diagram of an exemplary embodiment of an interconnect structure and an uppermost conductive layer in accordance with some embodiments. The interconnect structure 310 is electrically connected between the semiconductor structure 300 and an uppermost conductive layer M4. The semiconductor structure 300 comprises doped regions, such as p+ regions and n+ regions, to form the core array 111, the peripheral circuit 112 and the OCDs 113-116. The interconnect structure 310 electrically connects the core array 111, the peripheral circuit 112 and the OCDs 113-116. The uppermost conductive layer M4 provides power tracks for at least one of the core array 111, the peripheral circuit 112 and the OCDs 113-116.

As shown in FIG. 3, the interconnect structure 310 includes conductive layers M1-M3. The conductive layers M1-M3 provide an electrical connection between the semiconductor structure 300 and the uppermost conductive layer M4 via the contact holes V1-V4. In some embodiments, the thickness of the uppermost conductive layer M4 exceeds the thickness of each of the conductive layers M1, M2 and M3. Therefore, if the power tracks of the core array 111, the peripheral circuit 112, and/or the OCDs 113-116 are formed in the uppermost conductive layer M4, the level at which the power tracks are interfered by noise is reduced.

The disclosure does not limit the materials of the conductive layers M1-M4 and the uppermost conductive layer M4. In one embodiment, the materials of the conductive layers M1-M4 and the uppermost conductive layer M4 are Cu, Al or Au. In another embodiment, one of the conductive layers M1-M4 and the uppermost conductive layer M4 is different from the other the conductive layers M1-M4 and/or the uppermost conductive layer M4.

Figure 4:
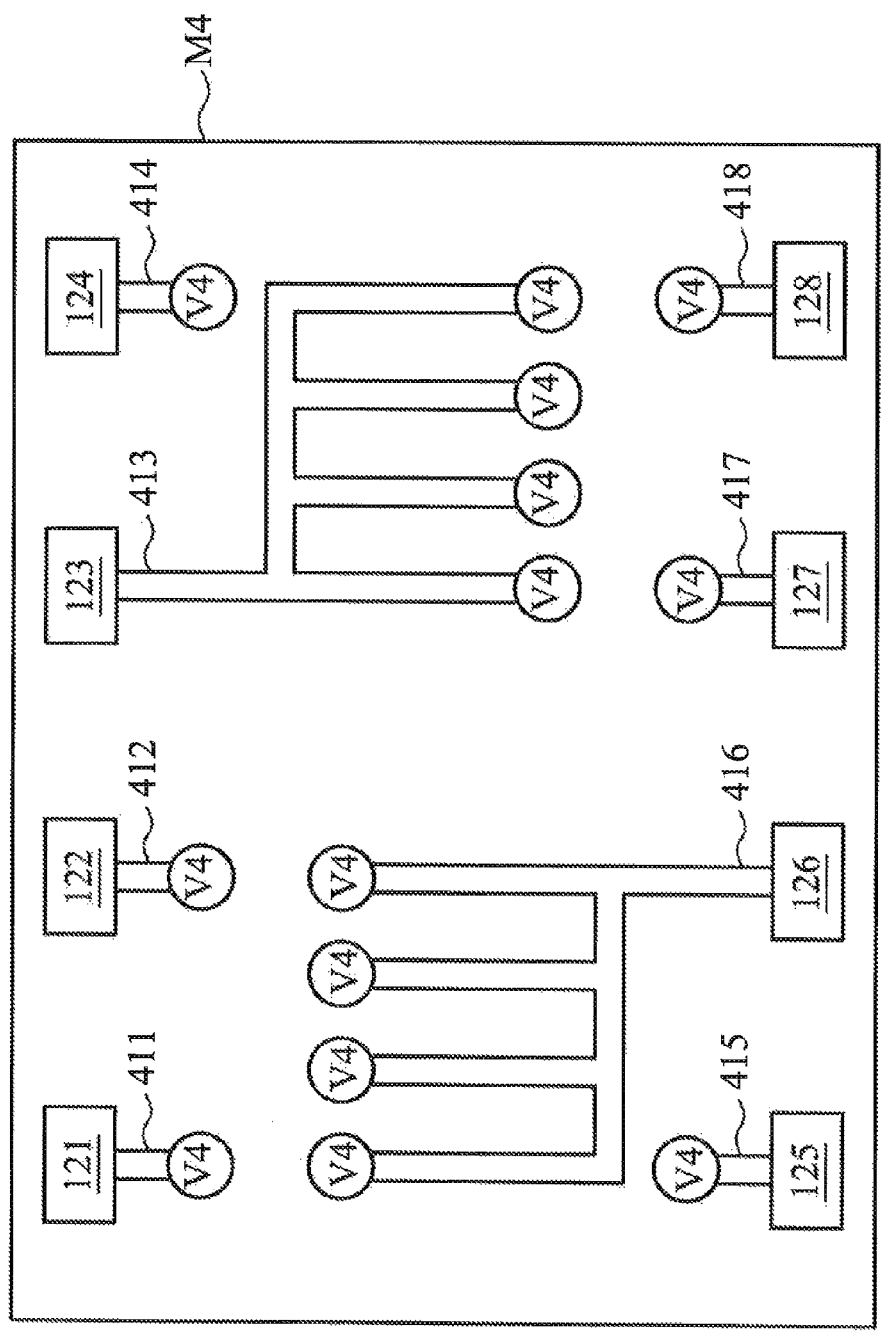
FIG. 4 is a schematic diagram of an exemplary embodiment of an uppermost conductive layer in accordance with some embodiments.

FIG. 4 is a schematic diagram of an exemplary embodiment of an uppermost conductive layer in accordance with some embodiments. The uppermost conductive layer M4 includes power tracks 413 and 416. The power track 413 transmits a high operation voltage to the core array 111, the peripheral circuit 112 and the OCDs 113-116 via the contact holes V4. The power track 416 transmits a low operation voltage to the core array 111, the peripheral circuit 112 and the OCDs 113-116 via the contact holes V4.

The uppermost conductive layer M4 further includes tracks 411-412, 414-415 and 417-418. The tracks 411, 414, 415 and 418 are electrically connected to the OCDs 113-116 via the contact holes V4 and the interconnect structure 300 to transmit external data received by the pads 121, 124, 125 and 128 or output internal data via the pads 121, 124, 125 and 128. In this embodiment, the tracks 412 and 417 are electrically connected to the peripheral circuit 112 via the contact holes V4 and the interconnect structure 300 to transmit the control commands received by the pads 122 and 127.

Figure 5:
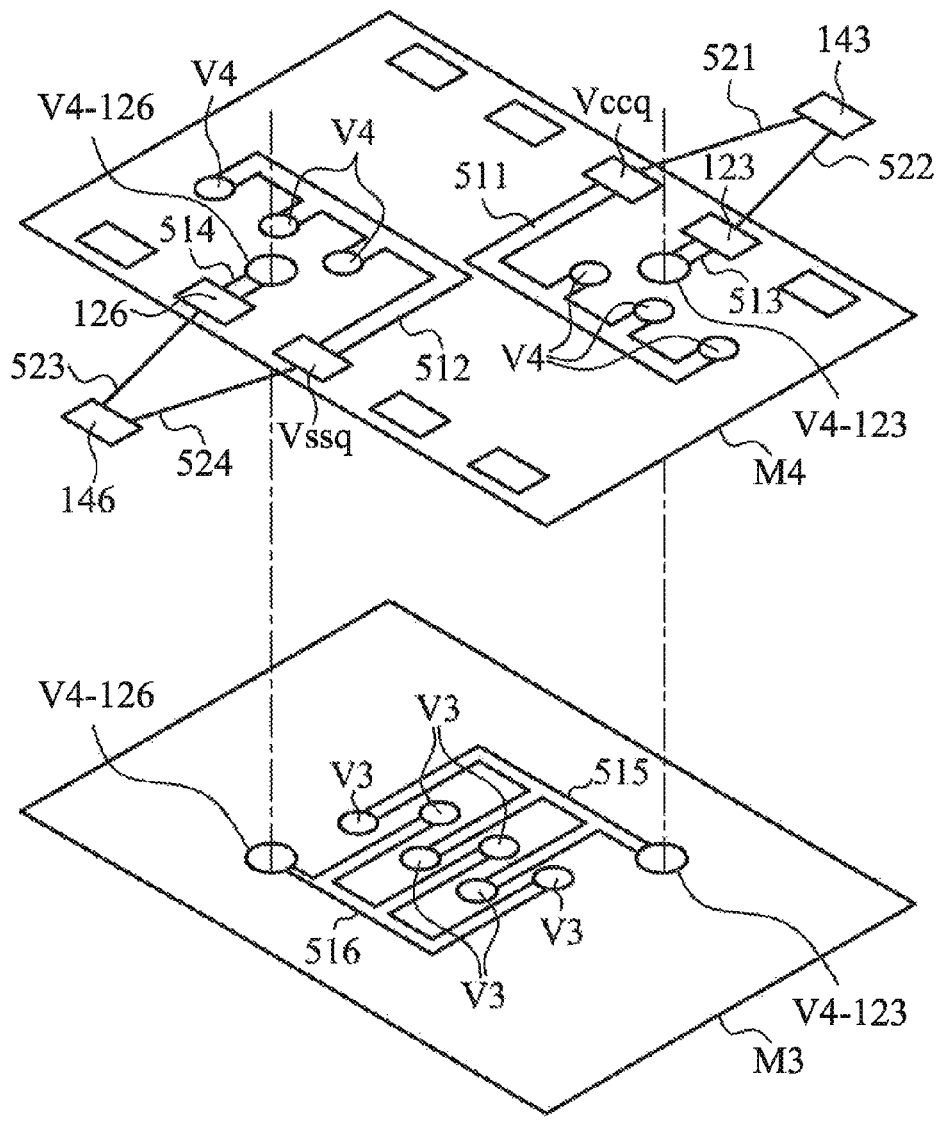
FIGS. 5 and 6 are schematic diagrams of some exemplary embodiments of an uppermost conductive layer in accordance with some embodiments.

FIG. 5 is a schematic diagram of another exemplary embodiment of an uppermost conductive layer in accordance with some embodiments. The pads 121-122, 124-125 and 127-128 and the corresponding tracks are not shown for brevity. FIG. 5 only shows power tracks 511-514 and pads 123, 126, Vccq and Vssq.

The pads 123, 123, Vccq and Vssq serve as power pads to transmit operation voltages to the core array 111, the peripheral circuit 112 and the OCDs 113-116. As shown in FIG. 5, the pad Vccq is electrically connected to the pin 143 via the bonding wire 521 to receive a high operation voltage, and the pad 123 is electrically connected to the pin 143 via the bonding wire 522 to receive the high operation voltage. The pad Vssq is electrically connected to the pin 146 via the bonding wire 524 to receive a low operation voltage. The pad 126 is electrically connected to the pin 146 via the bonding wire 523 to receive the low operation voltage.

In some embodiments, the power pad Vccq transmits voltage to the OCDs 113-116 via. the power track 511 and the contact holes V4, and the power pad Vssq transmits voltage to the OCDs 113-116 via the power track 512 and the contact holes V4. As shown in FIG. 5, the power tracks 511 and 512 are formed in the uppermost conductive layer M4. Furthermore, the power pad 123 is electrically connected to the power track 515 via the power track 513 and the contact hole V4-123. The power pad 126 is electrically connected to the power track 516 via the power track 514 and the contact hole V4-126. In some embodiments, the power tracks 515 and 516 are formed in the conductive layer M3 to transmit voltages to the core array 111 and the peripheral circuit 112.

Since the power tracks 511 and 512 transmitting power to the OCDs 113-116 are different from the power tracks 515 and 516 transmitting power to the core array 111 and the peripheral circuit 112, when the level of the power tracks 511 or 512 is changed due to the operation of the OCDs 113-116, the changed level does not affect the levels of the power tracks 515 and 516.

To clearly show the uppermost conductive layer M4, FIG. 5 does not show the positions of the contact holes V4 in the conductive layer M3. In fact, the contact holes V4 are electrically connected to the conductive layer M3. In one embodiment, some contact holes V4 pass through the conductive layer M3 to electrically connect to other conductive layers.

Figure 6:
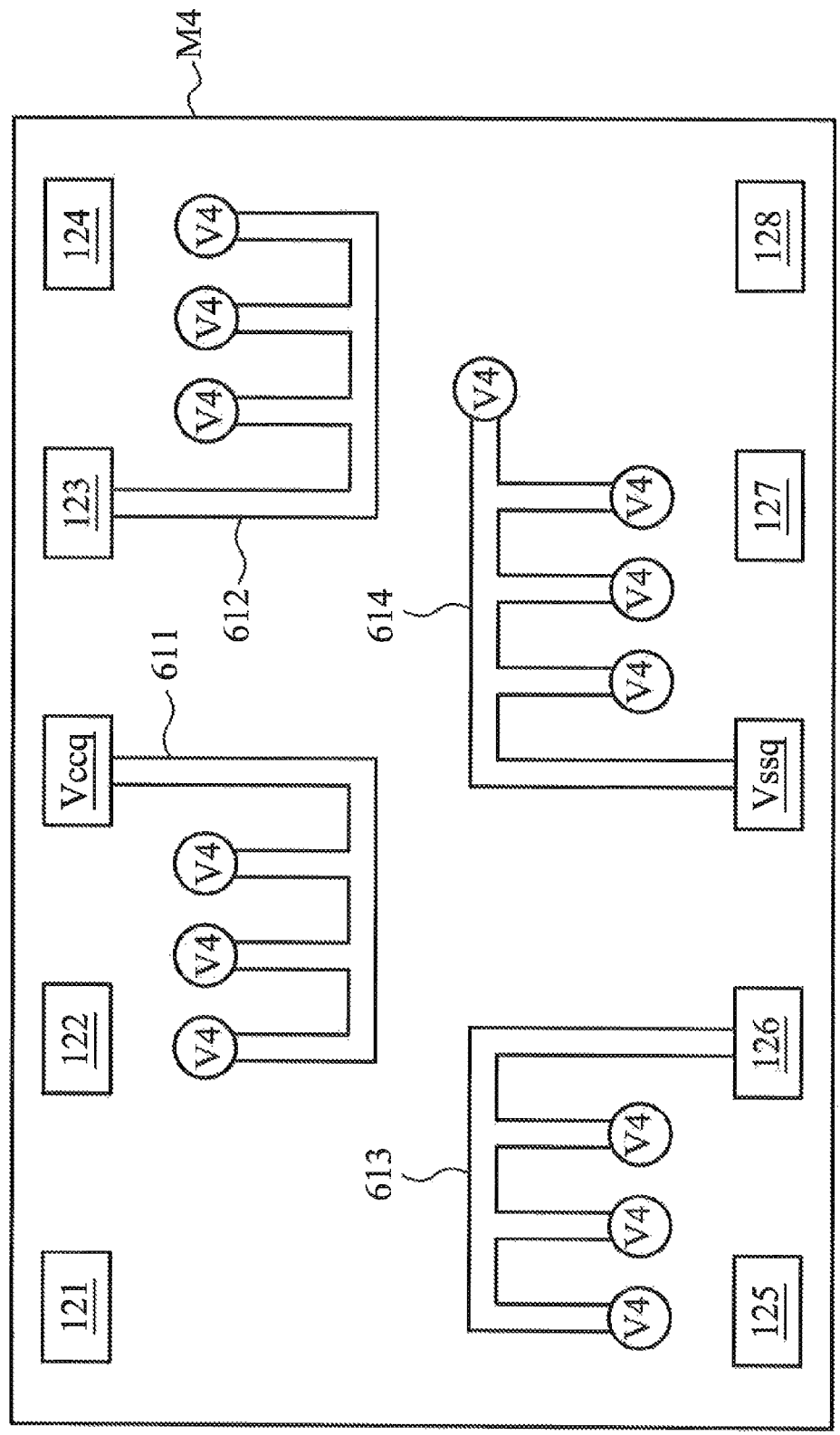

FIG. 6 is a schematic diagram of another exemplary embodiment of an uppermost conductive layer in accordance with some embodiments. Since the properties of the pads 123, Vccq, 126 and Vssq are described in FIG. 5, the descriptions of the pads 123, Vccq, 126 and Vssq are omitted for brevity. In this embodiment, the power pad Vccq provides a high operation voltage to the OCDs 113-116 via the power track 611 and the contact holes V4, and the power pad Vssq provides a low operation voltage to the OCDs 113-116 via the power track 614 and the contact holes V4. In addition, the power pad 123 provides the high operation voltage to the core array 111 and the peripheral circuit 112 via the power track 612 and the contact holes V4. The power pad 126 provides the low operation voltage to the core array 111 and the peripheral circuit 112 via the power track 613 and the contact holes V4.

Figures 7A, 7B, 7C:
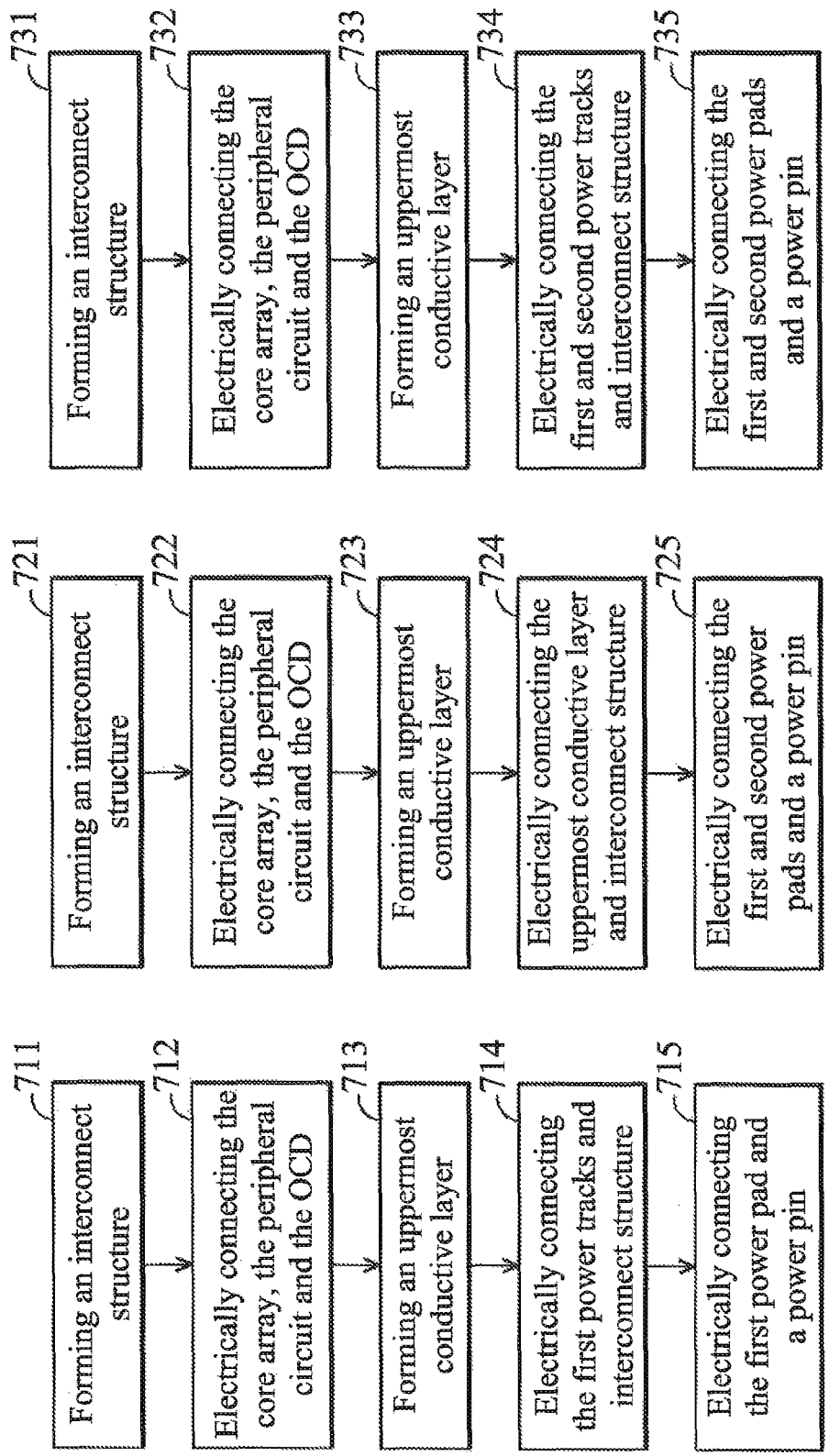
FIGS. 7A, 7B and 7C are flowcharts of some exemplary embodiments of a layout method in accordance with some embodiments.

FIG. 7A is a flowchart of an exemplary embodiment of a layout method in accordance with some embodiments. The layout method is applied in a flash memory. In some embodiments, the flash memory at least comprises a core array, a peripheral circuit and an OCD. The layout method begins with an operation 711 in which an interconnect structure is formed. In some embodiments, the interconnect structure has a first conductive layer, a second conductive layer and a third conductive layer. The first, second and third conductive layers are electrically connected to each other. The disclosure does not limit the materials of the first, second and third conductive layers. In one embodiment, the materials of the first, second and third conductive layers are Cu or Al. In other embodiments, the first, second and third conductive layers are connected to one another via contact holes.

The interconnect structure is utilized to electrically connect the core array, the peripheral circuit and the OCD in operation 712. In one embodiment, the elements of the core array, the peripheral circuit and the OCD are formed in a semiconductor substrate. The interconnect structure utilizes the contact holes to electrically connect the core array, the peripheral circuit and the OCD, and provides the connection lines of the core array, the peripheral circuit and the OCD.

An uppermost conductive layer is formed over the interconnect structure in operation 713. In some embodiments, the uppermost conductive layer at least includes a first power pad and first power tracks. The first power pad is electrically connected to all first power tracks. The disclosure does not limit the material of the uppermost conductive layer. In one embodiment, the material of the uppermost conductive layer may be the same as or different from the material of the first, second or third conductive layers. For example, the material of the uppermost conductive layer is Cu, Al or Au. In another embodiment, the thickness of the uppermost conductive layer exceeds the thickness of each of the first, second and third conductive layers.

The first power tracks are electrically connected to the interconnect structure in operation 714. In one embodiment, the first power tracks are electrically connected to the interconnect structure via contact holes.

The first power pad is electrically connected to a power pin in operation 715. In some embodiments, the first power pad is electrically connected to the power pin via a bonding wire. In another embodiment, the first pad transmits an operation voltage received by the power pin to at least one of the core array, the peripheral circuit and the OCD via the first power tracks and the interconnect structure. In this embodiment, the thickness of the uppermost conductive layer is sufficient to avoid the voltage levels of the power tracks being interfered by noise.

In one embodiment, the first power tracks in the uppermost conductive layer provide power to the core array, the peripheral circuit and the OCD. In another embodiment, the first power tracks in the uppermost conductive layer only provide power to the OCD. In this case, the power tracks of the core array and the peripheral circuit are formed in the interconnect structure. In one embodiment, the power tracks of the core array and the peripheral circuit are formed in an overlying layer of the interconnect structure. The overlying layer, such as the conductive layer M3, approaches the uppermost conductive layer.

FIG. 7B is a flowchart of another exemplary embodiment of a layout method in accordance with some embodiments. The layout method begins with operation 721 in which an interconnect structure is formed. In some embodiments, the interconnect structure includes a first conductive layer, a second conductive layer and a third conductive layer. The first, second and third conductive layers are arranged successively. The first conductive layer is an underlying layer of the interconnect structure and the third conductive layer is an overlying layer of the interconnect structure. In this embodiment, the third conductive layer has second power tracks.

The interconnect structure is utilized to electrically connect the core array, the peripheral circuit and the OCD in operation 722. In this embodiment, the first and second conductive layers of the interconnect structure provide connection lines to the core array, the peripheral circuit and the OCD. In another embodiment, some connection lines of the core array, the peripheral circuit and the OCD are provided by the third conductive layer of the interconnect structure. In other embodiments, the second power tracks formed in the third conductive layer transmit operation voltages to the core array and the peripheral circuit.

An uppermost conductive layer is formed on the interconnect structure in operation 723. In this embodiment, the uppermost conductive layer has a first power pad, a second power pad and first power tracks. The first power pad is electrically connected to the first power tracks.

The uppermost conductive layer is electrically connected to the interconnect structure in operation 724. At this time, the first power pad does not electrically connect to the second power pad. In this embodiment, the first power pad transmits power to the OCD via the first power tracks, and the second power pad transmits power to the core array and the peripheral circuit via the second power tracks.

The first and the second power pads are electrically connected to a power pin in operation 725. In one embodiment, the first and second power pads are electrically connected to the power pin via different bonding wires. Taking FIG. 5 as an example: the bonding wire 521 electrically connects the power pad Vccq to the power pin 143, and the bonding wire 522 electrically connects the power pad 123 to the power pin 143. Since the power tracks transmitting power to the OCD are different from the power tracks transmitting power to the core array and the peripheral circuit, when the voltage level of the power tracks of the OCD is changed, the voltage level of the power tracks of the core array and the peripheral circuit is not interfered by the changed voltage level of the power tracks of the OCD.

FIG. 7C is a flowchart of another exemplary embodiment of a layout method in accordance with some embodiments. The layout method begins with operation 731 in which an interconnect structure is formed. Since the interconnect structure in operation 731 is the same as the interconnect structure in operation 711, the description of the interconnect structure in operation 731 is omitted for brevity.

The interconnect structure is utilized to electrically connect the core array, the peripheral circuit and the OCD in operation 732. In this embodiment, the first, second and third conductive layers provide signal connection lines to the core array, the peripheral circuit and the OCD.

An uppermost conductive layer is formed over the interconnect structure in operation 733. In some embodiments, the uppermost conductive layer includes a first power pad, a second power pad, first power tracks, and second power tracks. The first power pad is electrically connected to the first power tracks. The second power pad is electrically connected to the second power tracks. At this time, the first power tracks are not electrically connected to the second power tracks.

The first and the second power tracks are electrically connected to the interconnect structure in operation 734. In this embodiment, the first power tracks in the uppermost conductive layer provide power to the OCD, and the second power tracks in the uppermost conductive layer provide power to the core array and the peripheral circuit.

The first and second power pads are electrically connected to a power pin in operation 735. Since the features of operations 735 and 725 are the same, the description of operation 735 is omitted for brevity. Since the power tracks (e.g. the first power tracks) providing power to the OCD are different from the power tracks (e.g. the second power tracks) providing power to the core array and the peripheral circuit, when the level of the power tracks of the OCD is changed, the level of the power tracks of the core array and the peripheral circuit is not interfered by the changed level of the power tracks of the OCD.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A flash memory, comprising:
 a core array storing data;
 a peripheral circuit accessing the data stored in the core array to generate read data;
 an off-chip driver (OCD) processing the read data to generate output data;
 an interconnect structure electrically connected to the core array, the peripheral circuit and the OCD, and comprising a first conductive layer, a second conductive layer and a third conductive layer, wherein the first, second and third conductive layers are electrically connected to one another; and
 an uppermost conductive layer formed over the interconnect structure, electrically connected to the interconnect structure, and comprising:
  a first power pad electrically connected to a power pin via a first bonding wire to receive an operation voltage; and
  a plurality of first power tracks electrically connected between the first power pad and the interconnect structure to transmit the operation voltage to at least one of the core array, the peripheral circuit and the OCD.

2. The flash memory as claimed in claim 1, wherein the uppermost conductive layer further comprises:
 an input/output pad electrically connected to an input/output pin via a second bonding wire to transmit the output data, wherein the input/output pad transmits the output data according to a serial transmission protocol.

3. The flash memory as claimed in claim 1, wherein the first power tracks transmit the operation voltage to the core array, the peripheral circuit and the OCD.

4. The flash memory as claimed in claim 1, wherein the uppermost conductive layer further comprises a second power pad electrically connected to the power tracks via a second bonding wire to receive the operation voltage.

5. The flash memory as claimed in claim 4, wherein the third conductive layer further comprises:
 a plurality of second power tracks electrically connected to the second power pad, wherein the OCD receives the operation voltage via the first power pad and the first power wires, and the core array and the peripheral circuit receive the operation voltage via the second power pad and the second power tracks.

6. The flash memory as claimed in claim 4, wherein the uppermost conductive layer further comprises:
 a plurality of second power tracks electrically connected to the second power pad and electrically connected to the interconnect structure, wherein the OCD receives the operation voltage via the first power pad and the first power tracks, and the core array and the peripheral circuit receive the operation voltage via the second power pad and the second power tracks.

7. The flash memory as claimed in claim 1, wherein the thickness of the uppermost conductive layer exceeds the thickness of the first conductive layer, the thickness of the second conductive layer, and the thickness of the third conductive layer.

8. A layout method for a flash memory comprising a core array, a peripheral circuit and an off-chip driver (OCD), comprising:
 forming an interconnect structure comprising a first conductive layer, a second conductive layer and a third conductive layer, wherein the first, second and third conductive layers are electrically connected to one another;
 utilizing the interconnect structure to electrically connect the core array, the peripheral circuit and the OCD;
 forming an uppermost conductive layer over the interconnect structure, wherein the uppermost conductive layer comprises a first power pad and a plurality of first power tracks electrically connected to the first power pad;
 electrically connecting the first power tracks and the interconnect structure;
 electrically connecting the first power pad and a power pin to receive an operation voltage, and transmitting the operation voltage to at least one of the core array, the peripheral circuit and the OCD via the first power tracks.

9. The layout method as claimed in claim 8, further comprising:
 forming a second power pad over the uppermost conductive layer; and
 electrically connecting the power pin and the second power pad.

10. The layout method as claimed in claim 9, further comprising:

forming a plurality of second power tracks in the third conductive layer; and electrically connecting the second power tracks and the second power pad, wherein the OCD receives the operation voltage via the first power pad and the first power tracks, and the core array and the peripheral circuit receive the operation voltage via the second power pad and the second power tracks.

11. The layout method as claimed in claim 9, further comprising:

forming a plurality of second power tracks in the uppermost conductive layer;

electrically connecting the second power pad and the second power tracks; and electrically connecting the interconnect structure and the second power tracks, wherein the OCD receives the operation voltage via the first power pad and the first power tracks, and the core array and the peripheral circuit receive the operation voltage via the second power pad and the second power tracks.

* * * * *